(12) United States Patent
Hoang et al.

(10) Patent No.: US 7,633,349 B2
(45) Date of Patent: Dec. 15, 2009

(54) PHASE FREQUENCY DETECTORS GENERATING MINIMUM PULSE WIDTHS

(75) Inventors: Tim Tri Hoang, San Jose, CA (US); Sergey Shumarayev, Los Altos Hills, CA (US); Wanli Chang, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 126 days.

(21) Appl. No.: 11/696,575

(22) Filed: Apr. 4, 2007

(65) Prior Publication Data

US 2008/0246516 A1 Oct. 9, 2008

(51) Int. Cl.
*H03L 1/00* (2006.01)
(52) U.S. Cl. ...................................... 331/176
(58) Field of Classification Search ............ 331/25, 331/1 A, 176; 327/2–3, 7, 12, 31, 36, 37, 327/83
See application file for complete search history.

(56) References Cited

U.S. PATENT DOCUMENTS

| | | | | |
|---|---|---|---|---|
| 5,990,671 A | * | 11/1999 | Nagata | 323/313 |
| 6,269,012 B1 | * | 7/2001 | Kusakabe et al. | 363/84 |
| 6,946,887 B2 | * | 9/2005 | Ho | 327/156 |

* cited by examiner

*Primary Examiner*—Rexford N Barnie
*Assistant Examiner*—Thienvu V Tran
(74) *Attorney, Agent, or Firm*—Steven J. Cahill

(57) ABSTRACT

A phase frequency detector compares a reference clock signal to a feedback clock signal to generate pulses in one or more output signals. The one or more output signals have a minimum pulse width. The phase frequency detector has a temperature sensing circuit. The phase frequency detector adjusts the minimum pulse width of the one or more output signals using the temperature sensing circuit to compensate for variations in the temperature of the phase frequency detector.

20 Claims, 10 Drawing Sheets

US 7,633,349 B2

PHASE FREQUENCY DETECTORS GENERATING MINIMUM PULSE WIDTHS

BACKGROUND OF THE INVENTION

The present invention relates to electronic circuits, and more particularly, to phase frequency detectors that generate signals having minimum pulse widths.

A phase-locked loop (PLL) is an electronic circuit with a voltage or current driven oscillator that is constantly adjusted to match in phase (and thus lock on) the frequency of a reference clock signal. In addition to stabilizing a particular communications channel by keeping it set to a particular frequency, a PLL can be used to generate a signal, modulate or demodulate a signal, reconstitute a signal with less noise, or multiply or divide a frequency.

A PLL typically includes a phase frequency detector (PFD), a charge pump, and a loop filter in addition to the oscillator. The PFD generates pulses in it output signals in response to the difference between the phase and frequency of a reference clock signal and a feedback clock signal from the oscillator. When the phase and frequency of the reference and feedback clock signals are the same, the PLL is in lock mode, and the PFD does not generate pulses in its output signals. When the PFD does not generate pulses in lock mode, the charge pump does not provide charge to the loop filter. As a result, charge leaks away from the loop filter, and the control voltage on the loop filter drifts away from a stable value.

To prevent the control voltage from drifting, most PLLs provide a well defined minimum short pulse width in the output signals of the PFD. However, a PFD that generates a minimum pulse width in lock mode is more sensitive to small differences in the phases of the reference clock signal and the feedback clock signal.

If the minimum pulse of the PFD is too narrow, the PLL has a larger static phase error. If the minimum pulse of the PFD is too wide, the PLL has a longer lock time. If the up and down charge pump current sources are not equal, a wider minimum pulse from the PFD can amplify any difference in the charge that is provided to and removed from loop filter when the PLL is in lock mode. As a result, a minimum pulse that is too wide can introduce more offset into the PLL loop.

Therefore, it would be desirable to provide a phase frequency detector that has a controllable minimum pulse width.

BRIEF SUMMARY OF THE INVENTION

A phase frequency detector compares a reference clock signal to a feedback clock signal to generate pulses in one or more output signals. The one or more output signals have a minimum pulse width.

According to some embodiments of the present invention, a phase frequency detector includes a temperature sensing circuit. The phase frequency detector adjusts the minimum pulse width of the one or more output signals using the temperature sensing circuit to compensate for temperature variations.

According to other embodiments of the present invention, a phase frequency detector senses a voltage across a diode, and adjusts a minimum pulse width of an output signal of the phase frequency detector in response to changes in the voltage across the diode. According to further embodiments of the present invention, methods are provided for sensing a temperature of a phase frequency detector, and adjusting a minimum pulse width of an output signal of the phase frequency detector to compensate for temperature variations.

Other objects, features, and advantages of the present invention will become apparent upon consideration of the following detailed description and the accompanying drawings.

DETAILED DESCRIPTION OF THE INVENTION

Figure 1:
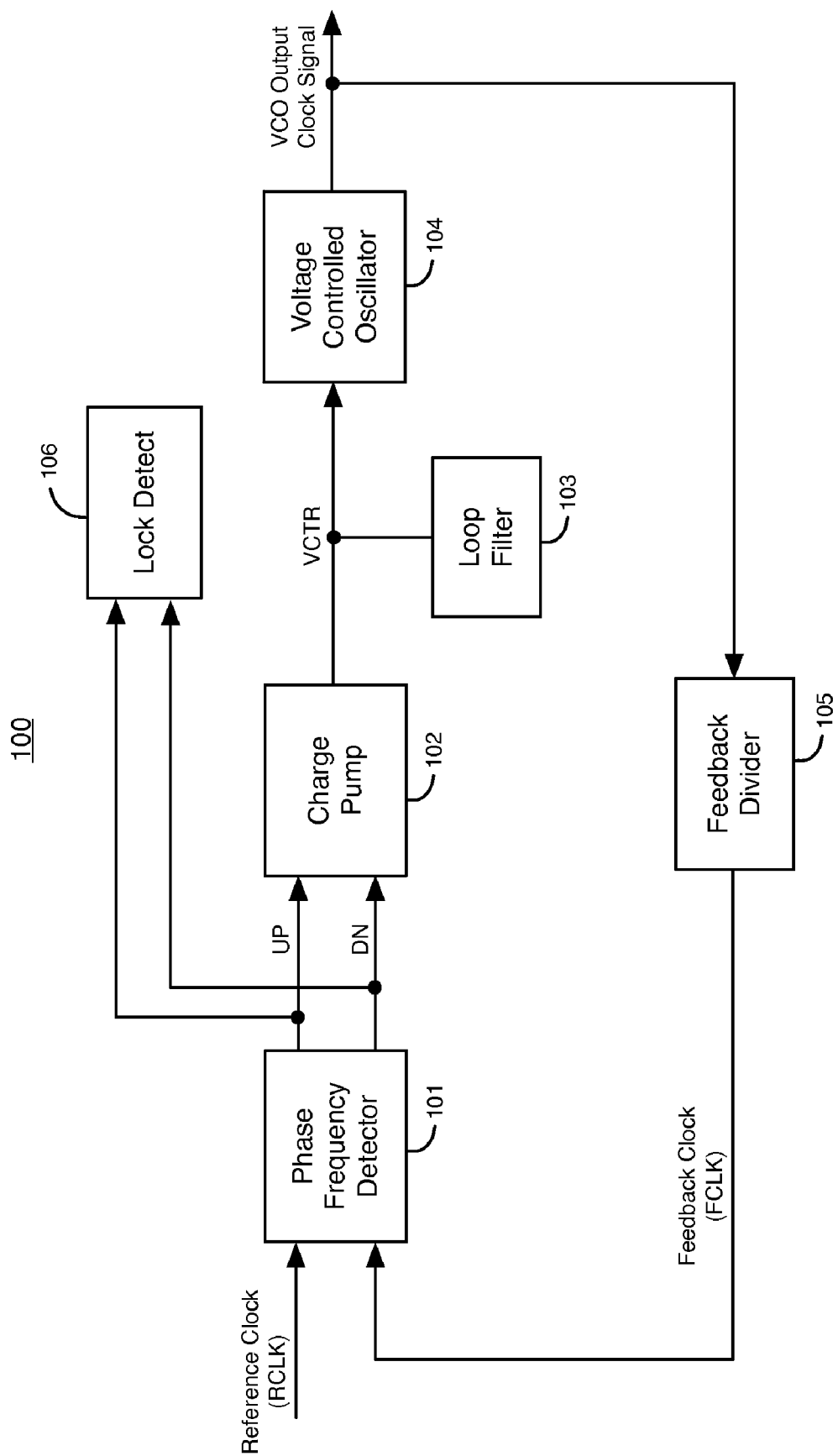
FIG. 1 illustrates an example of a phase-locked loop (PLL) that can include techniques of the present invention.

FIG. 1 illustrates an example of a phase-locked loop (PLL) 100 that can include embodiments of the present invention. PLL 100 includes phase frequency detector (PFD) 101, charge pump (CP) 102, loop filter (LF) 103, voltage-controlled oscillator (VCO) 104, feedback divider 105, and lock detect circuit (LD) 106. VCO 104 generates a VCO output clock signal. Feedback divider 105 includes a counter circuit that divides the frequency of the VCO output clock signal to generate a feedback clock signal (FCLK).

PFD 101 compares the phase and frequency of the reference clock signal (RCLK) to the phase and frequency of the feedback clock signal (FCLK). PFD 101 varies the width of pulses in its UP and DN output signals in response to differences in the phase and frequency of RCLK and FCLK, until the phase and frequency of FCLK and RCLK are the same. Typically, a pulse refers to a period of time when a digital signal is in a logic high state. However, according to alternative embodiments of the present invention, a pulse can refer to a period of time when a digital signal is in a logic low state.

The UP and DN output signals of PFD 101 are transmitted to inputs of charge pump 102. Charge pump 102 sends charge to a capacitor in loop filter 103 in response to pulses in the UP signal, causing voltage VCTR to increase. Charge pump 102 drains charge from the capacitor in loop filter 103 in response to pulses in the DN signal, causing voltage VCTR to decrease.

VCO 104 selects the frequency of the VCO output clock signal based on the voltage of VCTR.

If the frequency of FCLK is less than frequency of RCLK, PFD 101 increases the duration of the UP pulse to charge pump 102. In response the UP pulse, charge pump 102 delivers more charge to loop filter 103, causing voltage VCTR to increase and VCO 104 to increase the frequency of the VCO output clock signal until the frequencies of FCLK and RCLK match.

If the frequency of FCLK is greater than the frequency of RCLK, PFD 101 increases the duration of the DN pulse to charge pump 102. In response to the DN pulse, charge pump 102 removes charge from loop filter 103, causing voltage VCTR to decrease and VCO 104 to decrease the frequency of the VCO output clock signal until the frequencies of FCLK and RCLK match.

When the phase and frequency of FCLK and RCLK are the same, PLL 100 is in lock mode. Lock detect circuit 106 monitors the UP and DN output signals to determine if the phase and frequency of FCLK are locked onto the phase and frequency of RCLK. Voltage VCTR is ideally at a stable value when PLL 100 is in lock mode. However, process mismatches and other factors can cause a small phase difference between the phase of RCLK and the phase of FCLK even when PLL 100 is lock mode. This phase difference in lock mode is referred to as the static phase error.

Figure 2:
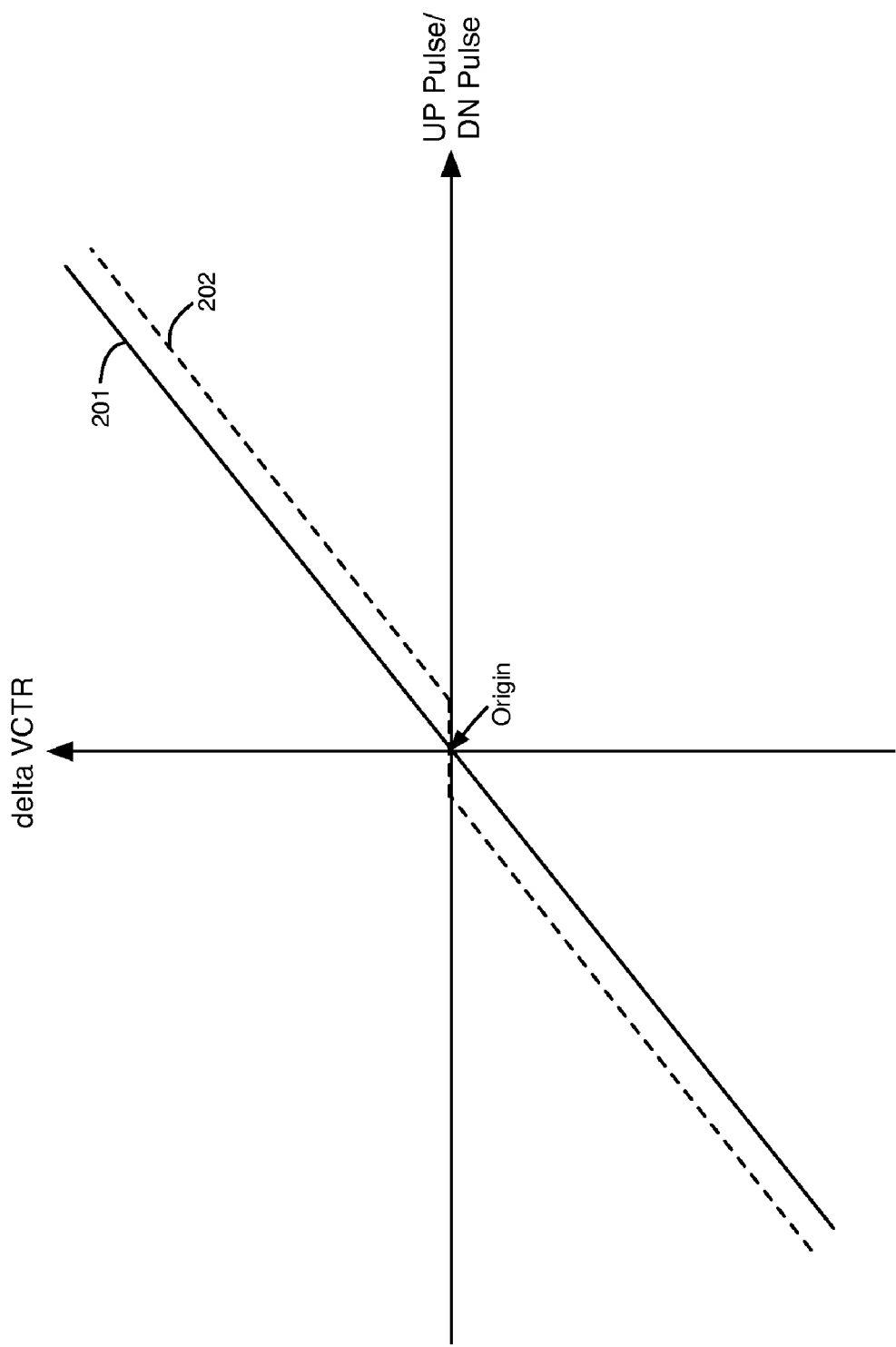
FIG. 2 is a graph that illustrates the change in the control voltage of a PLL in response to UP and DN pulses generated by a phase frequency detector.

FIG. 2 is a graph that illustrates the change in the control voltage VCTR in response to pulses in the UP and DN signals generated by PFD 101. The vertical axis marks the change in the control voltage (delta VCTR). If the difference between the UP pulse and the DN pulse is zero, control voltage VCTR ideally remains constant at the origin in FIG. 2 on solid line 201.

However, in practice, when PFD generates no UP or DN pulses for a period time, or the UP and DN pulses are too small for charge pump 102 to detect, charge can leak to or away from the capacitor in loop filter 103, causing voltage VCTR to vary. As the voltage VCTR varies, VCO 104 varies the frequency of the VCO output signal, causing phase offsets and increased output jitter when PLL 100 is in lock mode, as shown by dotted line 202. This type of behavior is referred to as a dead-band.

To prevent a dead-band, PFD 101 can generate a well defined minimum short pulse width in the UP and DN output signals. The minimum value of the pulse width that prevents the control voltage from drifting is determined primarily by the charge pump minimum input pulse width and the output rise and fall characteristics of the output signals of the PFD.

Figure 3:
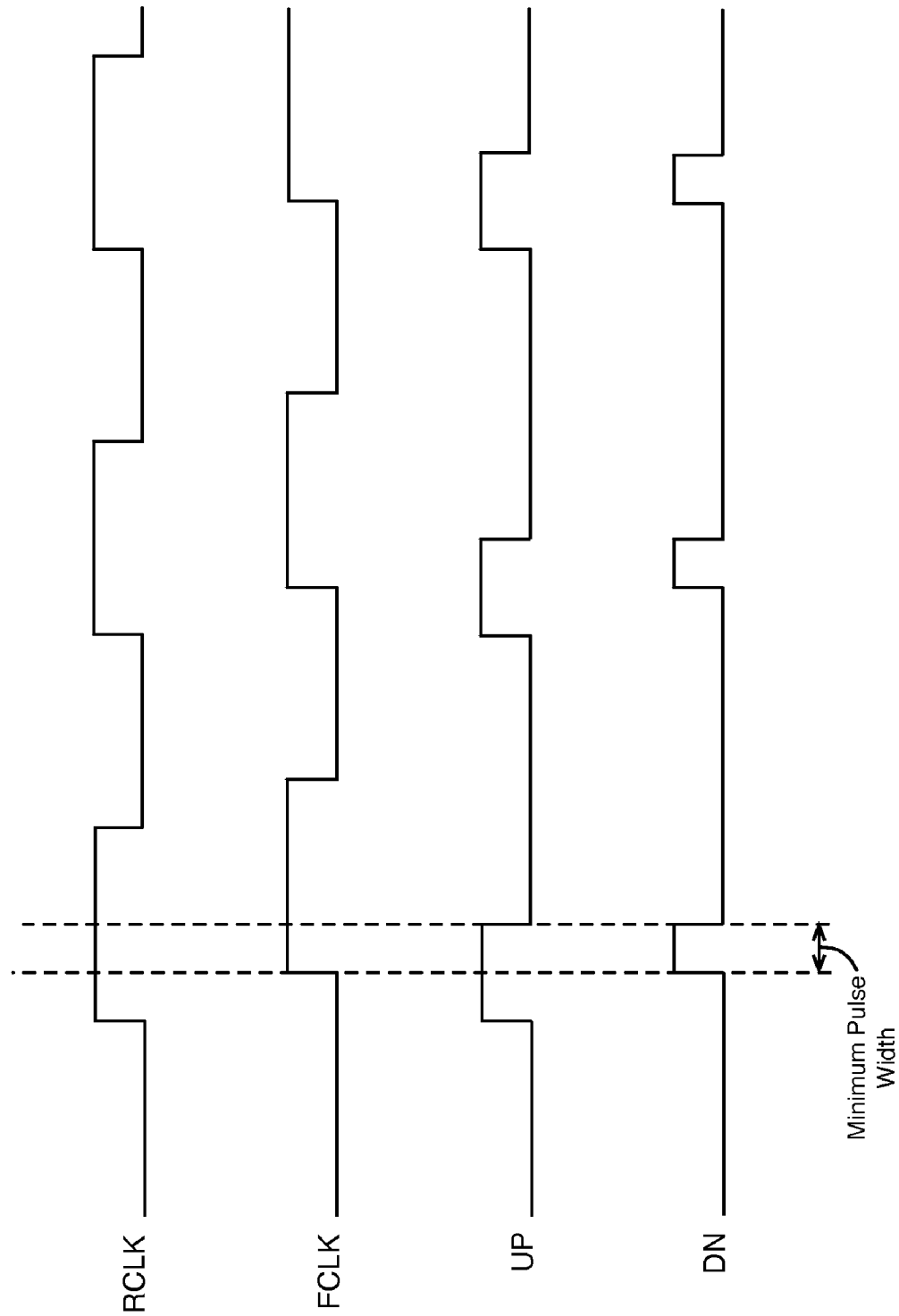
FIG. 3 is a timing diagram that illustrates an example of a minimum pulse width in the DN output signal of a phase frequency detector, according to an embodiment of the present invention.

FIG. 3 is a timing diagram that illustrates an example of a minimum pulse width in the DN output signal of PFD 101. In FIG. 3, the reference clock signal RCLK leads the feedback clock signal FCLK, generating a series of pulses in the DN signal and longer pulses in the UP signal. The width of the DN pulses in FIG. 3 is an example of the minimum pulse width in the DN signal. The difference in duration between the UP and DN pulses equals the difference in timing between the rising edges of RCLK and FCLK.

Charge pump 102 charges up the capacitor in loop filter 103 by an amount of charge ($Q_{UP}$) equal to the UP pulse width ($P_W$) times the current ($I_{CU}$) that charge pump 102 sends to loop filter 103 in response to UP pulses ($Q_{UP}=P_W*I_{CU}$). Charge pump 102 charges down the capacitor in loop filter 103 by an amount of charge ($Q_{DN}$) equal to the DN pulse width ($P_W$) times the current ($I_{CD}$) that charge pump 102 drains from loop filter 103 in response to DN pulses ($Q_{DN}=P_W*I_{CD}$). In this example, the widths ($P_W$) of the UP and DN signals have the same duration in lock mode. The total charge ($\Delta Q$) into or out of charge pump 102 is shown by equation (1).

$$\Delta Q = Q_{UP} - Q_{DN} = P_W \times (I_{CU} - I_{CD}) = C_{LOOP} \times \Delta V \quad (1)$$

In equation (1), $C_{LOOP}$ is the capacitance of loop filter 103, and $\Delta V$ is the change in the control voltage VCTR. If $I_{CU}$ equals $I_{CD}$, $\Delta V$ of VCTR on loop filter 103 is zero, and the frequency of the VCO output clock signal is unchanged. However, $I_{CU}$ and $I_{CD}$ are usually not equal in lock mode, which causes control voltage VCTR to shift from the desired value. The shift in VCTR causes jitter in the VCO output signal if the minimum pulse width of the UP and DN signals is too large. Normally, the minimum pulse width of the UP and DN signals is set to be as small as possible. For example, the maximum value of the minimum pulse width can be about ⅒ of the period of reference clock signal RCLK.

PLLs in some field programmable gate arrays (FPGAs) support more than one power supply voltage (e.g., normal and low power supply modes). However, variations in the power supply voltage provided to a PLL can change the minimum pulse width of the UP and DN signals generated by a PFD. Also, different process corners and temperature variations on an integrated circuit can change the minimum pulse width of the UP and DN signals. Changes in the minimum pulse width can adversely effect a PLL's static phase offset and performance characteristics.

Figure 4:
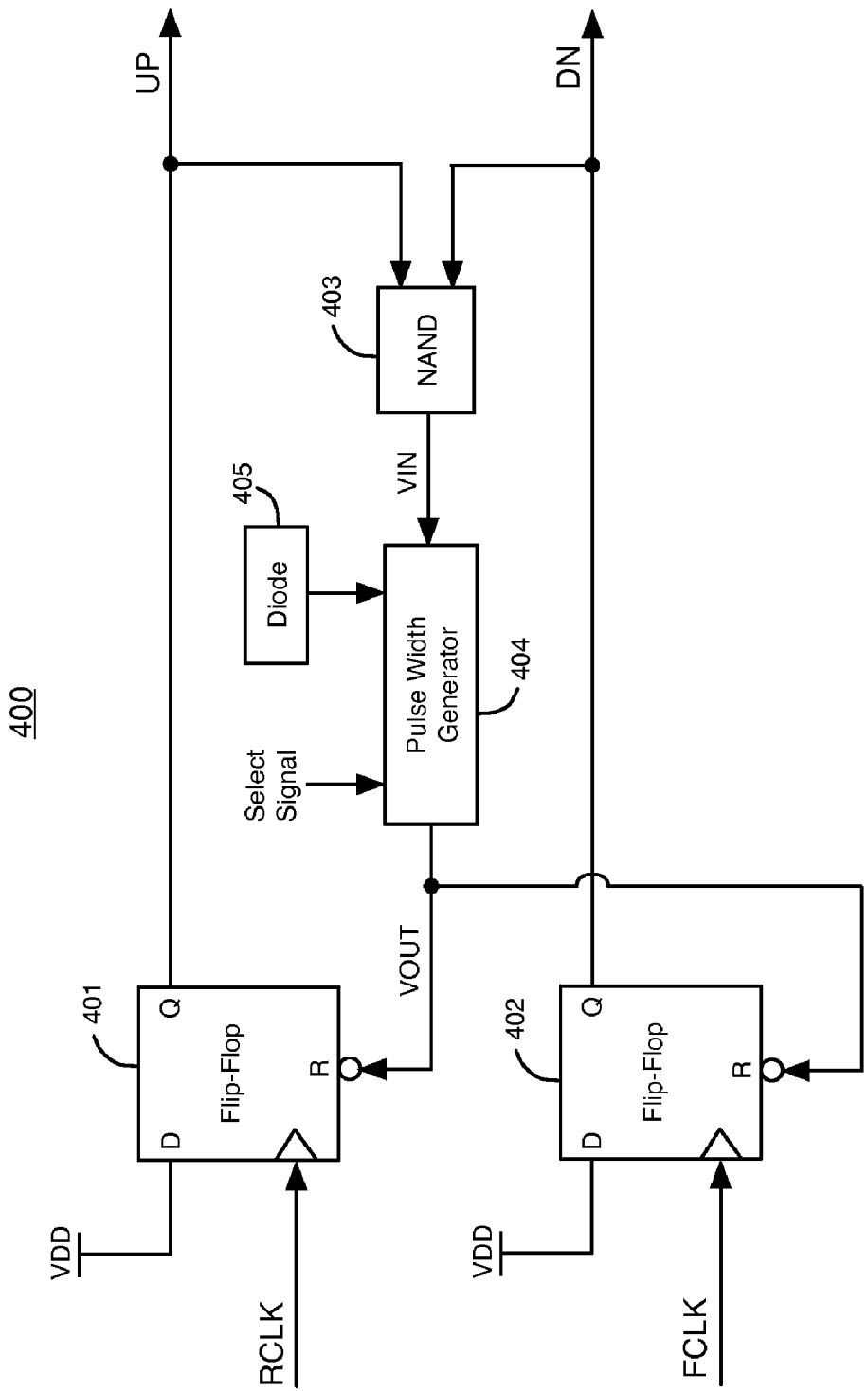
FIG. 4 illustrates a phase frequency detector that can adjust the minimum pulse width of the UP and DN output signals, according to an embodiment of the present invention.

FIG. 4 illustrates a phase frequency detector 400 that can adjust the minimum pulse width of the UP and DN output signals, according to an embodiment of the present invention. Phase frequency detector (PFD) 400 is an example of PFD 101 in FIG. 1. PLL 100 is merely one example of PLL that can include PFD embodiments of the present invention. PFD 400 can also be used in PLLs that have other configurations.

PFD 400 includes D flip-flop 401, D flip-flop 402, NAND logic gate 403, pulse width generator 404, and diode 405. The D input of flip-flop 401 is coupled to receive a power supply voltage VDD. The D input of flip-flop 402 is also coupled to receive the power supply voltage VDD. The clock input of flip-flop 401 is coupled to receive the reference input clock signal RCLK. The clock input of flip-flop 402 is coupled to receive the feedback clock signal FCLK from a feedback loop (e.g., feedback divider 105). The reset input R of flip-flop 401 is coupled to receive the output signal VOUT of pulse width generator 404. The reset input R of flip-flop 402 is also coupled to receive the output signal VOUT of pulse width generator 404.

The Q output of flip-flop 401 generates the UP output signal of PFD 400. The UP output signal transitions to a logic high after a rising edge in reference clock signal RCLK is received at the clock input of flip-flop 401 as shown, for example, in FIG. 3. A transition in a logic signal from a logic low to a logic high is referred to as a rising edge.

The Q output of flip-flop 402 generates the DN output signal of PFD 400. The DN output signal transitions to a logic high after a rising edge in feedback clock signal FCLK is received at the clock input of flip-flop 402 as shown, for example, in FIG. 3.

NAND gate 403 is a logic gate that performs a NAND Boolean logic function on the UP and DN signals to generate a voltage signal VIN. The output signal VIN of NAND 403 is provided to an input of pulse width generator 404. VIN is a logic high when either of the UP or DN signals is a logic low. VIN is a logic low when both of the UP and DN signals are a logic high at the same time.

Pulse width generator 404 delays the output signal VIN of NAND gate 403 to generate an output signal VOUT. Pulse width generator 404 can include, for example, one or more delay circuits. After the UP and DN signals both become a logic high at the same time, NAND gate 403 generates a falling edge on VIN. A transition in a logic signal from a logic high to a logic low is referred to as a falling edge. Pulse width generator 404 generates a falling edge in VOUT a delayed period of time after the falling edge in VIN. Thus, pulse width generator 404 generates a delay between a falling edge of VIN and a subsequent falling edge of VOUT.

Flip-flop 401 generates a falling edge in the UP signal after a falling edge in the VOUT signal from pulse width generator 404 is received at the reset input R of flip-flop 401. Flip-flop 402 generates a falling edge in the DN signal after a falling edge in the VOUT signal from pulse width generator 404 is received at the reset input R of flip-flop 402. In general, the falling edges in the UP and DN signals occur at the same time as shown, for example, in FIG. 3.

The time delay (T1) that NAND gate 403 takes to generate a falling edge in VIN plus the time delay (T2) that a falling edge in VIN takes to propagate through pulse width generator 404 to VOUT plus the time delay (T3) for flip-flops 401 and 402 to generate falling edges in the UP and DN signals after a falling edge in VOUT equal the minimum pulse width (MPW) of the UP and DN signals (T1+T2+T3=MPW). After the UP and DN signals transition to a logic low, NAND gate 403 generates a rising edge in VIN, and pulse width generator 404 generates a rising edge in VOUT a delayed period of time later.

The pulse width generator 404 receives a signal from diode 405 and a select signal. The delay that pulse width generator 404 provides to signal VIN varies in response to variations in the signal from diode 405 and the select signal. Further details of pulse width generator 404 are described below with respect to FIGS. 5, 6A, 6B, and 6C.

Figure 5:
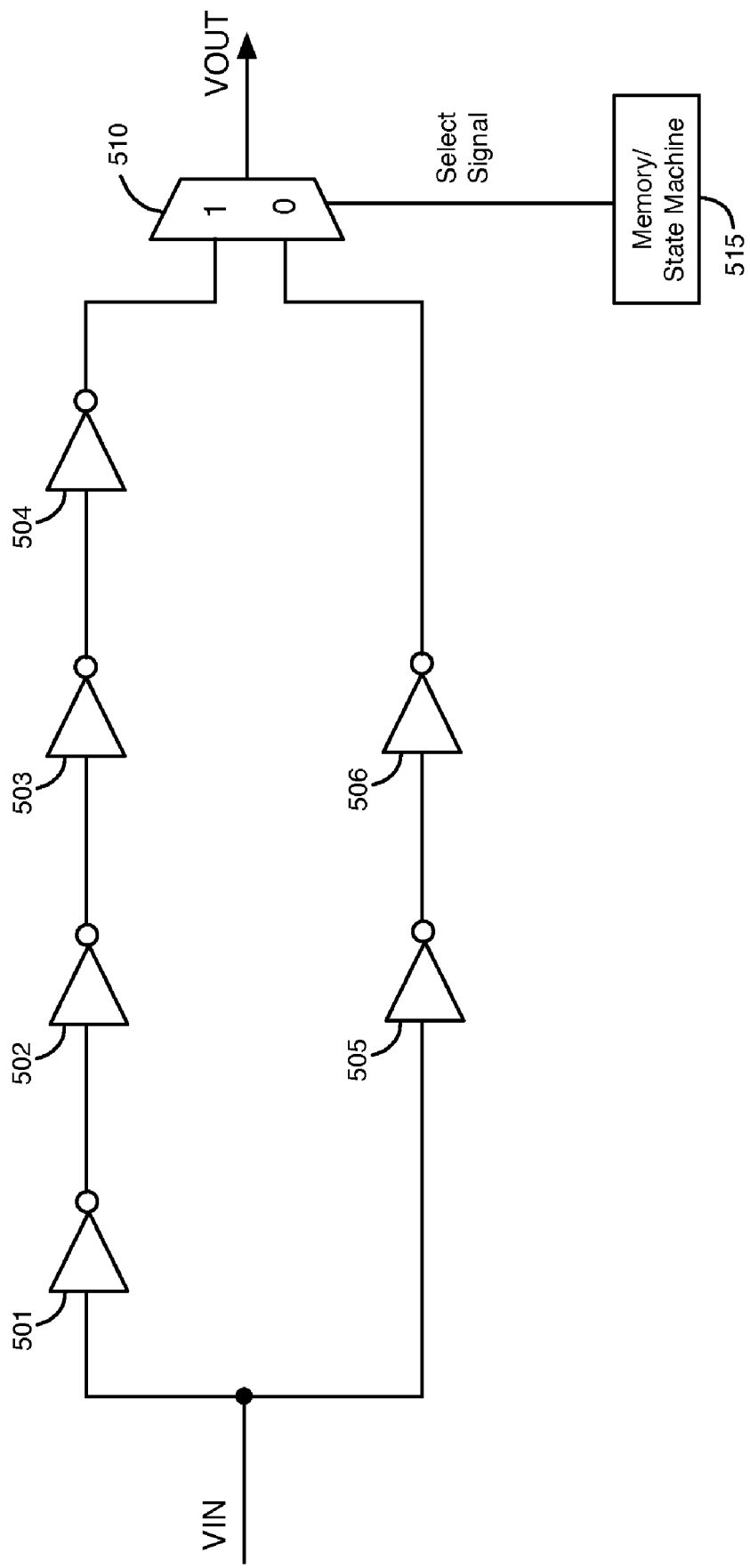
FIG. 5 illustrates an example of a pulse width generator with two alternate delay paths, according to another embodiment of the present invention.

FIG. 5 illustrates an example of pulse width generator 404, according to another embodiment of the present invention. The pulse width generator of FIG. 5 includes 6 inverters 501-506, multiplexer 510, and circuit 515. Inverters 501-506 function as delay circuits. Inverters 501-504 are coupled together in series between NAND gate 403 at VIN and a first input of multiplexer 510 to form a first delay path. Inverters 505 and 506 are coupled together in series between NAND gate 403 at VIN and a second input of multiplexer 510 to form a second delay path.

Multiplexer 510 is controlled by a select signal that is transmitted from circuit 515. Circuit 515 transmits the select signal to a select input of multiplexer 510. The select signal selects the first delay path through inverters 501-504 or the second delay path through inverters 505-506. When the select signal is a logic high (1), multiplexer 510 transmits the output signal of inverter 504 to the output of generator 404 as output signal VOUT. When the select signal is a logic low (0), multiplexer 510 transmits the output signal of inverter 506 to the output of generator 404 as output signal VOUT. Rising and falling edges on VIN take more time to travel through inverters 501-504 than through inverters 505-506. Thus, multiplexer 510 is set to select the path through inverters 501-504 to increase the delay provided to VOUT, and multiplexer 510 is set to select the path through inverters 505-506 to decrease the delay provided to VOUT.

FIG. 5 illustrates merely two examples of delay paths that can be used to implement pulse width generator 404. According to further embodiments of the present invention, pulse width generator 404 can have 3, 4, 5, 6, or more separate delay paths. Each of the delay paths can have any suitable number of inverters or any suitable number of another type of delay circuit.

According to one embodiment of FIG. 5, circuit 515 is a memory circuit that stores a static state for the select signal. The state of the select signal can be changed by storing a new value for the select signal in memory. For example, memory circuit 515 can store configuration bits in a field programmable gate array, where one of the configuration bits is used to generate the select signal. In embodiments of the present invention that include 3 or more delay paths, circuit 515 transmits multiple select signals to the multiplexer to select the appropriate delay path.

The logic state of the select signal can be changed, for example, in response to a change in the temperature of the integrated circuit. As another example, the logic state of the select signal can be changed in response to a change in the power supply voltage provided to the phase frequency detector. Field programmable gate array chips typically support two or more power supply voltages, allowing the user to switch between the supported power supply voltages.

For example, when the power supply voltage provided to inverters 501-506 decreases, the time it takes for edges in VIN to pass through inverters 501-506 increases. If the power supply voltage decreases, the state of the select signal is changed from a logic high to a logic low. As a result, multiplexer 510 selects the shorter path through inverters 505-506 to compensate for the increased time it takes for edges in VIN to pass through inverters 501-506 in order to maintain the minimum pulse width of the UP and DN signals constant or nearly constant.

As another example, when the power supply voltage provided to inverters 501-506 increases, the time it takes for edges in VIN to pass through inverters 501-506 decreases. If the power supply voltage increases, the state of the select signal is changed from a logic low to a logic high. As a result, multiplexer 510 selects the longer path through inverters 501-504 to compensate for the decreased time it takes for edges in VIN to pass through inverters 501-506 in order to maintain the minimum pulse width of the UP and DN signals constant or nearly constant.

According to another embodiment of the present invention, circuit 515 is a state machine. The state machine generates the select signal that controls multiplexer 510. State machine 515 can dynamically change the state of the select signal that controls multiplexer 510 to adjust the minimum pulse width of the UP and DN signals. For example, state machine 515 can change the state of the select signal in response to a change in the frequency of the reference clock signal RCLK provided to the PLL to maintain the minimum pulse width of the UP and DN signals at a predefined percentage (or within a percentage range) of the period of RCLK. The state machine can be implemented, for example, in soft programmable logic blocks.

When the frequency of the reference clock signal RCLK increases, state machine 515 reduces the delay of pulse width generator 404 by selecting the path through inverters 505 and 506. When the frequency of the reference clock signal RCLK decreases, state machine 515 increases the delay of pulse width generator 404 by selecting the path through inverters 501-504.

Figure 6A:
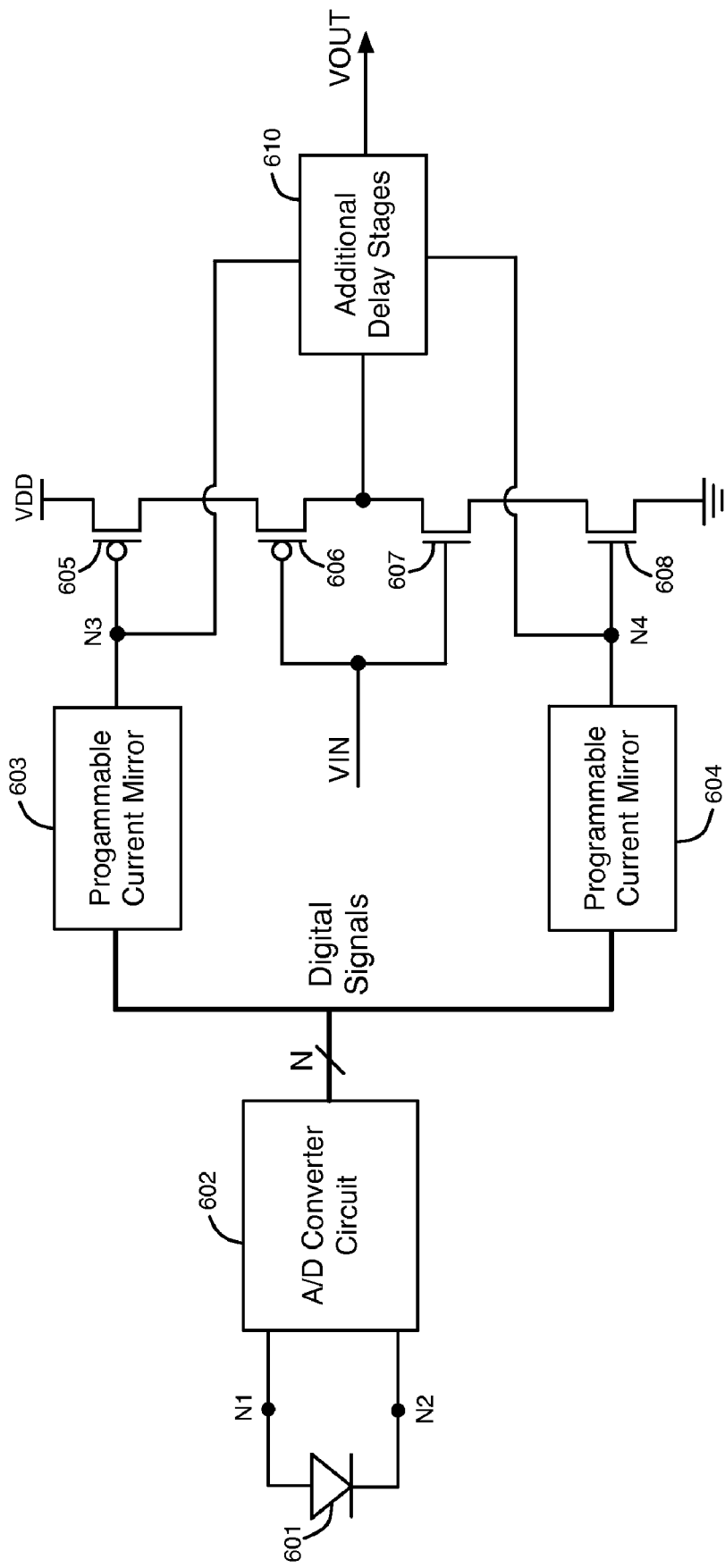
FIG. 6A illustrates an example of a pulse width generator that includes a temperature sensitive diode, according to a further embodiment of the present invention.

FIG. 6A illustrates another example of pulse width generator 404, according to a further embodiment of the present invention. The pulse width generator of FIG. 6A includes a diode 601, an analog-to-digital (A/D) converter circuit 602, programmable current mirror 603, programmable current mirror 604, p-channel MOS field-effect transistors 605-606, n-channel MOS field-effect transistors 607-608, and additional delay stages 610.

Diode 601 can be a PN junction diode, a bipolar junction transistor connected as a diode (i.e., short base to collector), a Schottky diode, or any other type of diode. The threshold voltage of diode 601 is inversely proportional to the temperature of the diode. As the temperature of the diode increases, the threshold voltage of the diode decreases. As the temperature of the diode decreases, the threshold voltage of the diode increases. Because the relationship between the temperature and the threshold voltage of the diode is predictable across a wide temperature range, the threshold voltage of the diode can be measured to determine the temperature of the diode. The temperature of the diode generally indicates the temperature of the phase frequency detector and the entire integrated circuit die that the diode is fabricated in.

A/D converter circuit 602 is coupled to diode 601 at nodes N1 and N2. A/D converter 602 has a current driver that drives current through diode 601. When the voltage across diode 601 is above its threshold voltage, diode 601 conducts current. A/D converter 602 also has a voltage measuring circuit that measures the voltage across diode 601.

A/D converter circuit 602 converts the analog voltage measured across diode 601 into a set of N digital output signals. A/D converter circuit 602 varies the logic states of its N digital output signals in response to changes in the voltage across diode 601. The logic states of the N digital output signals are indicative of the temperature of diode 601. Diode 601 and A/D converter 602 form a temperature sensing circuit.

The N digital output signals of A/D converter circuit 602 are transmitted in parallel to N inputs of programmable current mirror circuit 603 and programmable current mirror circuit 604. Programmable current mirror 603 generates a control voltage at node N3 for controlling the current through p-channel transistor 605 and other transistors in additional delay stages 610. Node N3 is coupled to the gate of transistor 605. Programmable current mirror 604 generates a control voltage at node N4 for controlling the current through n-channel transistor 608 and other transistors in additional delay stages 610. Node N4 is coupled to the gate of transistor 608.

Transistors 605-608 are coupled together in series. P-channel transistor 606 and n-channel transistor 607 are coupled together to form an inverter. The inverter formed by transistors 606 and 607 is the first delay circuit in the pulse width generator of FIG. 6A. The pulse width generator of FIG. 6A includes additional delay circuits that are represented by additional delay stages 610. The delay circuits are typically coupled together in series. Each of the additional delay circuits in stages 610 can have, for example, 4 transistors that are coupled in together in the same configuration as transistors 605-608, with 2 of the transistors being coupled as an inverter.

The gates of transistors 606-607 are coupled to receive an input voltage signal VIN from NAND gate 403. The output signal of transistors 606-607 is transmitted to an input of the next delay circuit in additional delay stages 610. Rising and falling edges in VIN propagate through inverter 606/607 and the additional delay circuits in stages 610 to VOUT. Output voltage signal VOUT is a delayed version of VIN.

Figure 6B:
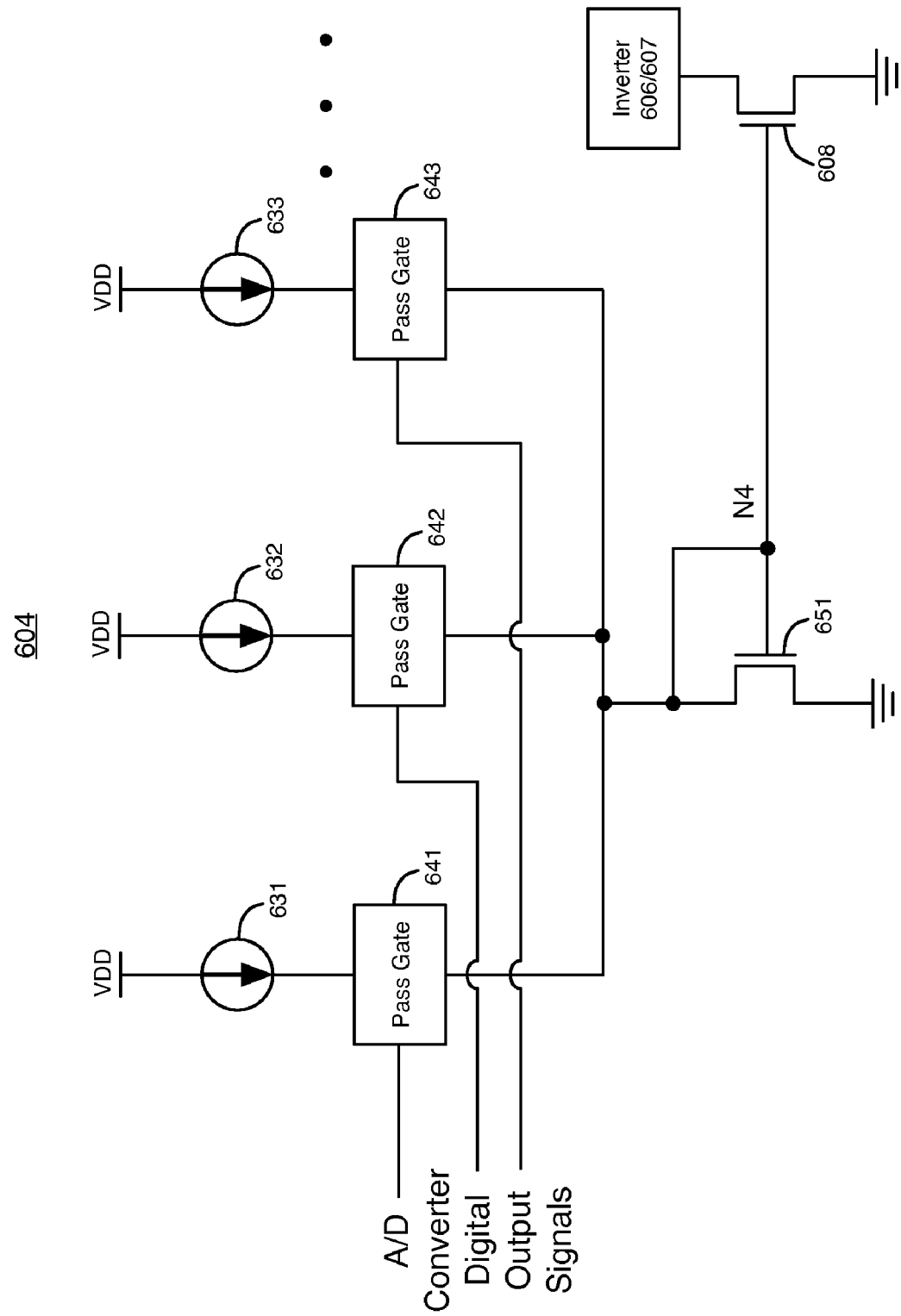
FIG. 6B illustrates a first example of programmable current mirror, according to another embodiment of the present invention.

FIG. 6B illustrates an example of programmable current mirror 604, according to another embodiment of the present invention. The programmable current mirror of FIG. 6B includes current sources 631-633, pass gates 641-643, and n-channel MOS field-effect transistors 608 and 651. Current sources 631-633 are coupled to pass gates 641-643, respectively. Current sources 631-633 are also coupled to receive power supply voltage VDD.

Pass gates 641-643 conduct current when they are on, and block current flow when the they are off. When pass gate 641 is on, current source 631 drives current (e.g., 5 milliamps) through transistor 651. When pass gate 642 is on, current source 632 drives current (e.g., 5 milliamps) through transistor 651. When pass gates 643 is on, current source 633 drives current (e.g., 5 milliamps) through transistor 651.

Three of the digital output signals of A/D converter 602 are transmitted to inputs of pass gates 641-643. The digital output signals from A/D converter 602 control the current through n-channel transistor 651 by selectively turning pass gates 641-643 on or off. For example, A/D converter 602 can increase the current through transistor 651 by turning on more of pass gates 641-643, and A/D converter 602 can decrease the current through transistor 651 by turning off more of pass gates 641-643. Programmable current mirror 604 can also include additional current sources and pass gates that are controlled by additional output signals from A/D converter 602.

Transistors 651 and 608 are coupled in a current mirror configuration. The current through transistor 608 is proportional to the current through transistor 651. The current through transistor 608 is determined by the width-to-length (W/L) channel ratios of transistors 608 and 651. In general, when the current through transistor 651 increases, the current through transistor 608 also increases, and when the current through transistor 651 decreases, the current through transistor 608 also decreases.

Figure 6C:
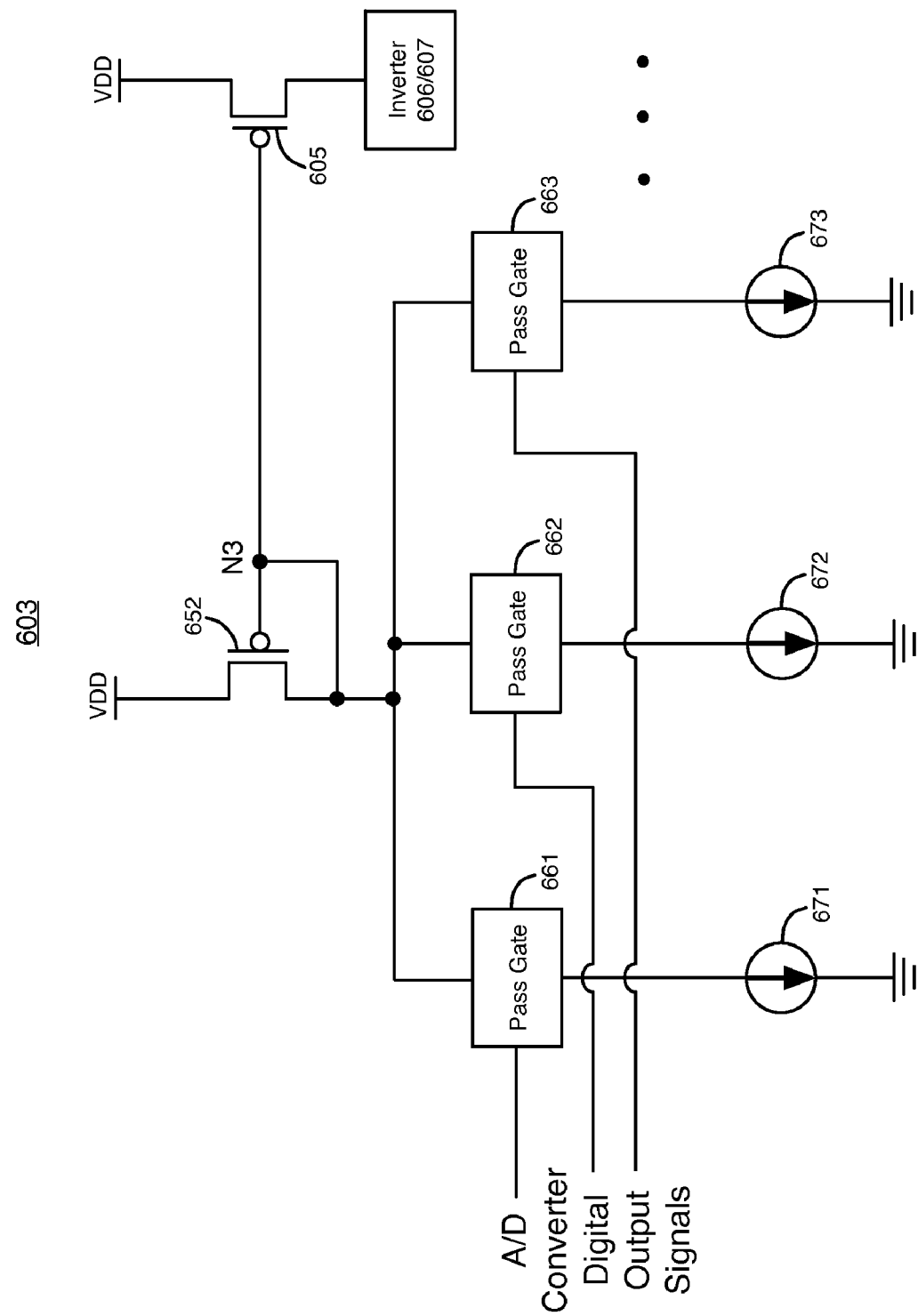
FIG. 6C illustrates a second example of programmable current mirror, according to yet another embodiment of the present invention.

FIG. 6C illustrates an example of programmable current mirror 603, according to another embodiment of the present invention. The programmable current mirror of FIG. 6C includes p-channel MOS field-effect transistors 652 and 605, pass gates 661-663, and current sources 671-673. Current sources 671-673 are coupled to pass gates 661-663, respectively, and ground.

The digital output signals from A/D converter 602 control the current through p-channel transistor 652 by selectively turning pass gates 661-663 on or off. For example, A/D converter 602 can increase the current through transistor 652 by turning on more of pass gates 661-663, and A/D converter 602 can decrease the current through transistor 652 by turning off more of pass gates 661-663. Programmable current mirror 603 can also include additional current sources and pass gates that are controlled by additional output signals from A/D converter 602.

Current sources 631-633 and 671-673 can be constant current sources. In some embodiments, current sources 631-633 each generate the same amount of current, and current sources 671-673 each generate the same amount of current. According to alternative embodiments, current sources 631-633 and 671-673 can generate binary weighted currents (1x, x/2, x/4, etc.).

Transistors 652 and 605 are coupled in a current mirror configuration. The current through transistor 605 is proportional to the current through transistor 652. The current through transistor 605 is determined by the width-to-length (W/L) channel ratios of transistors 605 and 652. In general, when the current through transistor 652 increases, the current through transistor 605 also increases, and when the current through transistor 652 decreases, the current through transistor 605 also decreases.

In general, an increase in the temperature of a circuit causes the circuit to operate more slowly, and the rising and falling edges of the signals are longer. After the threshold voltage of diode 601 decreases in response to an increase in temperature, A/D converter 602 causes programmable current mirrors 603 and 604 to send more current through transistors 605-608. As a result, inverter 606/607 and the other delay circuits operate more quickly to compensate for the increase in temperature.

Specifically, after the temperature of diode 601 and the PFD increases, the pulse width generator of FIG. 6A decreases the duration of the rising and falling edges in the output signals of inverter 606/607 and the delay circuits in additional delay stages 610.

In general, a decrease in the temperature of a circuit causes the circuit to operate faster, and the rising and falling edges of the signals are shorter. After the threshold voltage of diode 601 increases in response to a decrease in temperature, A/D converter 602 causes programmable current mirrors 603 and 604 to send less current through transistors 605-608. As a result, inverter 606/607 and the delay stages 610 operate more slowly to compensate for the decrease in temperature. Specifically, after the temperature of diode 601 and the PFD decreases, the pulse width generator of FIG. 6A increases the duration of the rising and falling edges in the output signals of inverter 606/607 and the delay circuits in additional delay stages 610.

The pulse width generator of FIG. 6A also varies the delay of the delay circuits in additional delay stages 610 in response to changes in the threshold voltage of diode 601. Thus, the pulse width generator of FIG. 6A can be used to adjust the duration of the minimum pulse width of the UP and DN signals in response to changes in the temperature of diode 601 using a temperature sensing circuit. The pulse width generator of FIG. 6A can, for example, be configured to maintain the minimum pulse width of the UP and DN signals at approximately the same width over a range of temperatures. For example, the phase frequency detector of FIGS. 4 and 6A/6B/6C can cause the variation in the minimum pulse width of the UP and DN signals to be less than 5% of the minimum pulse width over a range of temperatures.

According to one embodiment of FIG. 4, pulse width generator 404 includes the architectures shown in FIGS. 5, 6A, 6B, and 6C. Specifically, each of the inverters 501-506 in FIG. 5 is coupled to a different set of transistors 605 and 608 that are controlled by programmable current mirror circuits 603-604, and A/D converter 602, and diode 601, as shown in FIG. 6A. According to other embodiments of FIG. 4, pulse width generator 404 includes the architecture of FIG. 5 or the architectures of FIGS. 6A/6B/6C.

As described above, the architectures of FIGS. 4, 5, 6A, 6B, and 6C can vary the minimum pulse width of a PFD. These circuit architectures can vary the minimum pulse width of the UP and DN signals to an extent that significantly reduces the PLL static phase offset to meet stringent requirements in some specifications, without effecting the PLL characteristics when the PLL is in lock.

Figure 7:
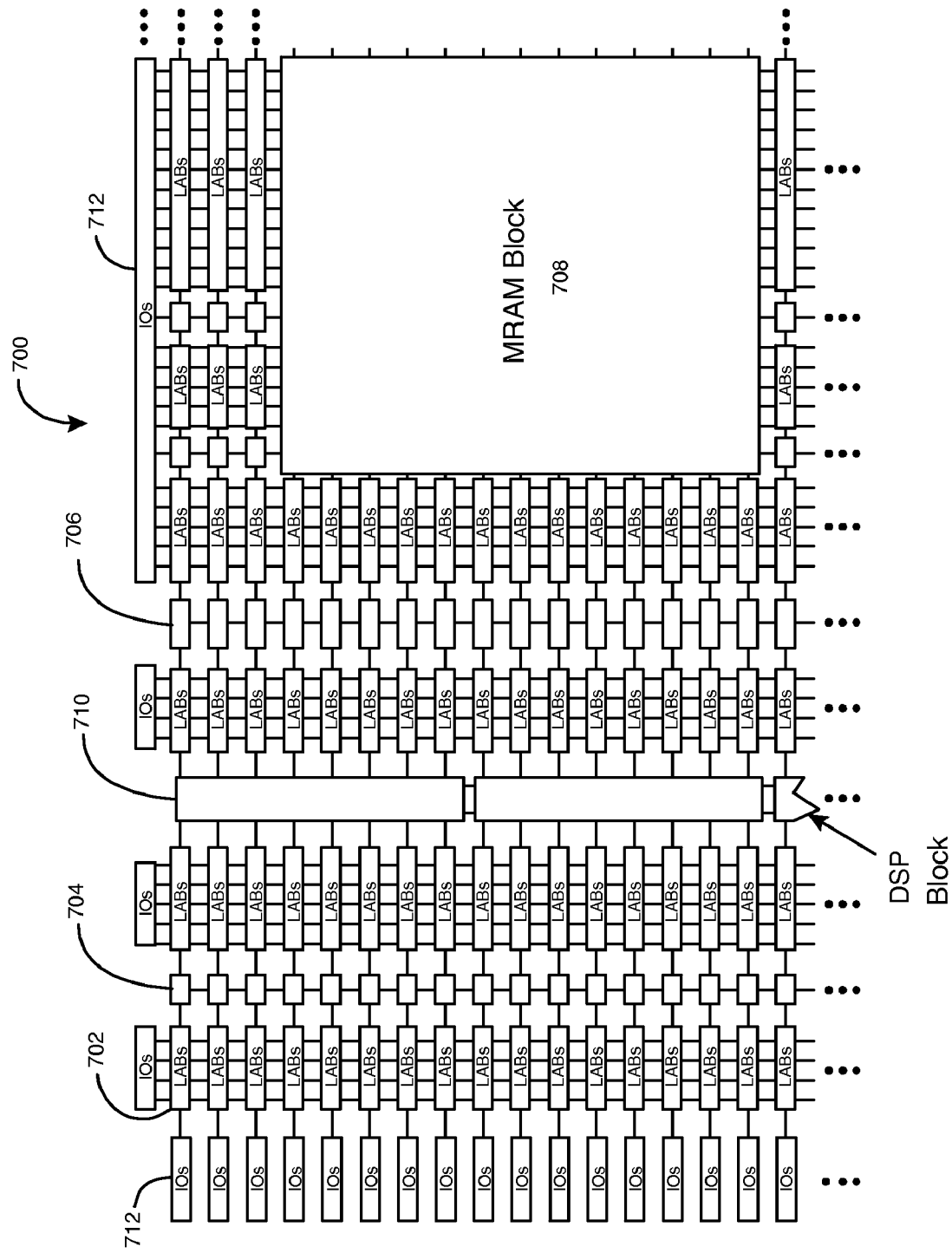
FIG. 7 is a simplified block diagram of a field programmable gate array (FPGA) that can embody the techniques of the present invention.

FIG. 7 is a simplified partial block diagram of an FPGA 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including RAM blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. IO blocks (IOs) 712 located, in this example, around the periphery of the chip support numerous single-ended and differential input/output standards. The IO blocks 712 contain IO buffers and are typically grouped into IO banks. It is to be understood that FPGA 700 is described herein for illustrative purposes only and that the present invention can be implemented in many different types of PLDs, FPGAs, and the like.

Figure 8:
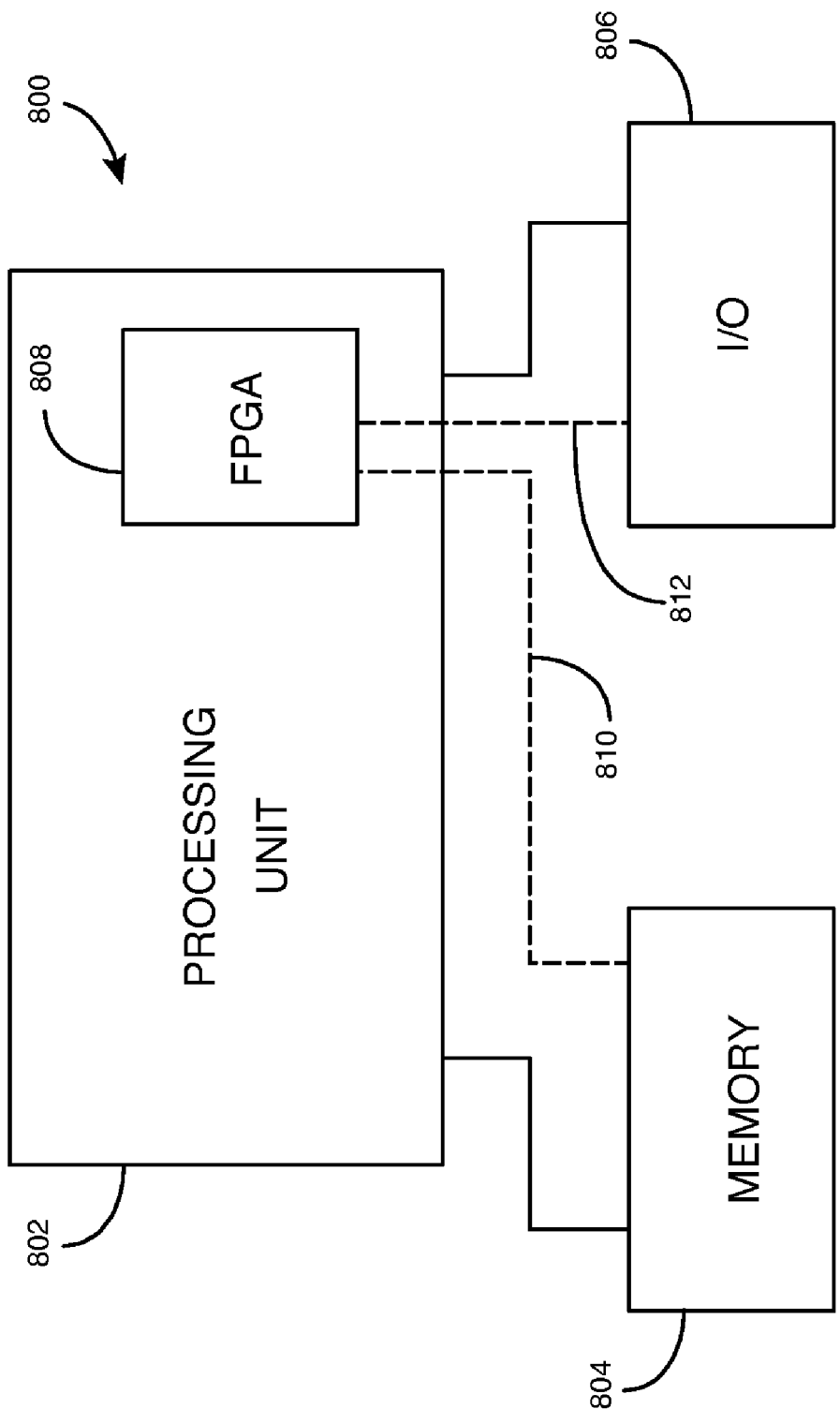
FIG. 8 is a block diagram of an electronic system that can implement embodiments of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed.

A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. A circuit comprising:
   a phase detector that compares first and second clock signals to generate pulses in a first output signal of the phase detector, wherein the circuit adjusts a phase of the second clock signal in response to a phase difference between the first and the second clock signals to reduce the phase difference between the first and the second clock signals, and
   wherein the phase detector comprises a temperature sensing circuit, and the phase detector adjusts a minimum pulse width of the first output signal using the temperature sensing circuit to reduce variations in the minimum pulse width of the first output signal that are caused by changes in a temperature of the phase detector.

2. The circuit defined in claim 1 wherein the temperature sensing circuit comprises a diode, and the phase detector adjusts the minimum pulse width of the first output signal in response to changes in a voltage across the diode.

3. The circuit defined in claim 1 wherein the temperature sensing circuit causes the phase detector to maintain the minimum pulse width of the first output signal at a substantially constant width.

4. A circuit comprising:
   a phase detector that compares first and second clock signals to generate pulses in an output signal of the phase detector,
   wherein the phase detector comprises a temperature sensing circuit, and the phase detector adjusts a minimum pulse width of the output signal in response to changes in a voltage across a diode, and
   wherein the temperature sensing circuit comprises an analog-to-digital converter circuit that converts the voltage across the diode into digital output signals.

5. The circuit defined in claim 4 wherein the phase detector further comprises:
   a first programmable current mirror circuit coupled to receive the digital output signals from the analog-to-digital converter circuit; and
   a second programmable current mirror circuit coupled to receive the digital output signals from the analog-to-digital converter circuit.

6. The circuit defined in claim 5 wherein the phase detector further comprises:
   a first delay circuit;
   wherein the first programmable current mirror circuit controls a current supplied to the first delay circuit in response to the digital output signals, and
   the second programmable current mirror circuit controls a current drained from the first delay circuit in response to the digital output signals.

7. A circuit comprising:
   a phase detector that compares first and second clock signals to generate pulses in a first output signal of the phase detector,
   wherein the phase detector comprises a temperature sensing circuit, and the phase detector adjusts a minimum pulse width of the first output signal using the temperature sensing circuit to reduce variations in the minimum pulse width of the first output signal that are caused by changes in a temperature of the phase detector, and
   wherein the phase detector compares the first and the second clock signals to generate pulses in a second output signal of the phase detector, and the phase detector adjusts a minimum pulse width of the second output signal using the temperature sensing circuit.

8. The circuit defined in claim 7 wherein the phase detector comprises:
   a first flip-flop coupled to receive the first clock signal the first flip-flop generating the first output signal;
   a second flip-flop coupled to receive the second clock signal the second flip-flop generating the second output signal;
   a logic gate coupled to receive the first and the second output signals;
   a first delay path comprising a first set of delay circuits, the first delay path receiving an output signal of the logic gate;
   a second delay path comprising a second set of delay circuits, the second delay path receiving the output signal of the logic gate; and
   a multiplexer having a first input coupled to the first delay path and a second input coupled to the second delay path.

9. The circuit defined in claim 7 wherein the phase detector is part of a phase-locked loop that further comprises:
   a charge pump coupled to receive the first and the second output signals; and
   a loop filter coupled to the charge pump wherein the charge pump supplies charge to the loop filter in response to pulses in the first output signal of the phase detector, and the charge pump drains charge from the loop filter in response to pulses in the second output signal of the phase detector.

10. A method for generating an output signal of a phase detector, the method comprising:
    comparing a first clock signal to a second clock signal to generate pulses in the output signal of the phase detector;
    adjusting a phase of the second clock signal in response to a phase difference between the first and the second clock signals to reduce the phase difference between the first and the second clock signals;
    sensing a temperature of the phase detector; and
    adjusting a minimum pulse width of the output signal to compensate for variations in the temperature of the phase detector.

11. A method for generating output signals of a phase frequency detector, the method comprising:
    comparing a first clock signal to a second clock signal to generate pulses in a first output signal of the phase frequency detector and to generate pulses in a second output signal of the phase frequency detector;
    sensing a temperature of the phase frequency detector; and
    adjusting a minimum pulse width of the first output signal and adjusting a minimum pulse width of the second output signal to compensate for variations in the temperature of the phase frequency detector.

12. The method defined in claim 11 wherein adjusting the minimum pulse width of the first output signal and the minimum pulse width of the second output signal to compensate for the variations in the temperature further comprises measuring a voltage across a diode.

13. The method defined in claim 12 wherein adjusting the minimum pulse width of the first output signal and the minimum pulse width of the second output signal to compensate for the variations in the temperature further comprises generating digital signals based on the measured voltage across the diode using an analog-to-digital converter.

14. The method defined in claim 13 wherein adjusting the minimum pulse width of the first output signal and the minimum pulse width of the second output signal to compensate for the variations in the temperature further comprises generating a first current supplied to a first delay circuit in response to the digital signals using a first programmable current mirror circuit and generating a second current drained from the first delay circuit in response to the digital signals using a second programmable current mirror circuit.

15. The method defined in claim 14 wherein generating the first current supplied to the first delay circuit in response to the digital signals using the first programmable current mirror circuit further comprises controlling conductive states of first pass gates using the digital signals to determine an amount of current provided to a first transistor from a first set of current sources, and wherein generating the second current drained from the first delay circuit in response to the digital signals using the second programmable current mirror circuit further comprises controlling conductive states of second pass gates using the digital signals to determine an amount of current provided to a second transistor from a second set of current sources.

16. The method defined in claim 11 wherein adjusting the minimum pulse width of the first output signal and the minimum pulse width of the second output signal to compensate for the variations in the temperature further comprises selecting one of a first delayed signal generated by first delay circuits and a second delayed signal generated by second delay circuits using a multiplexer.

17. The method defined in claim 11 wherein the phase frequency detector is part of a phase-locked loop circuit that includes a charge pump and a loop filter, and wherein the charge pump supplies charge to the loop filter in response to pulses in the first output signal of the phase frequency detector and the charge pump drains charge from the loop filter in response to pulses in the second output signal of the phase frequency detector.

18. A circuit comprising:
a phase detector that compares a first clock signal to a second clock signal to generate pulses in first and second output signals of the phase detector, wherein the phase detector comprises;
a diode; and
a pulse width generator circuit that senses a voltage across the diode, and that adjusts a minimum pulse width of the first output signal and a minimum pulse width of the second output signal in response to changes in the voltage across the diode to reduce variations in the minimum pulse widths of the first and the second output signals that are caused by changes in a temperature of the phase detector.

19. The circuit defined in claim 18 wherein the phase detector maintains the minimum pulse width of the first output signal and the minimum pulse width of the second output signal substantially constant over temperature variations of the phase detector.

20. The circuit defined in claim 18 further comprising:
a charge pump that supplies current to a filter in response to a pulse in the first output signal and that drains current from the filter in response to a pulse in the second output signal.

* * * * *